Oct. 7, 1969 H. PFANDER ETAL 3,471,752
SEMICONDUCTOR DEVICE WITH AN INSULATING BODY INTERPOSED BETWEEN A SEMICONDUCTOR ELEMENT AND A PART OF A CASING
Filed Feb. 3, 1966
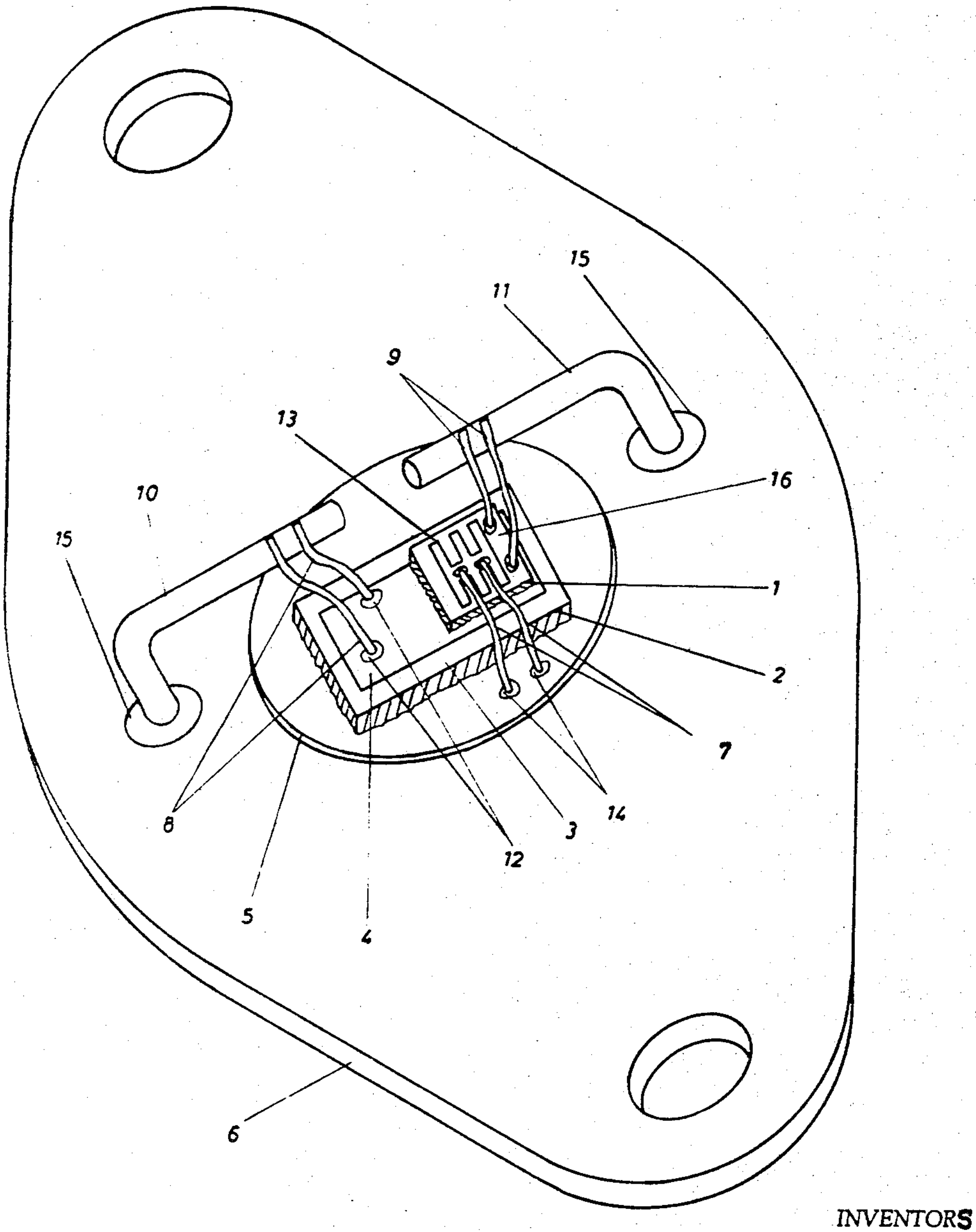
INVENTORS
HANS PFANDER
EGON SCHULZ
ANTON WIRTH
BY Percy P. Lantzy
ATTORNEY 3,471,752

SEMICONDUCTOR DEVICE WITH AN INSULATING BODY INTERPOSED BETWEEN A SEMICONDUCTOR ELEMENT AND A PART OF A CASING

Hans Pfander, Egon Schulz, and Anton Wirth, Freiburg, Germany, assignors to International Standard Electric Corporation, New York, N.Y., a corporation of Delaware Filed Feb. 3, 1966, Ser. No. 524,812
Claims priority, application Germany, Feb. 16, 1965, J 27,519
Int. Cl. H01l 5/00, 11/00
U.S. Cl. 317—234 9 Claims

ABSTRACT OF THE DISCLOSURE

This is a semiconductor device having a semiconductor element mounted on a header so that the element is thermally connected to but electrically insulated from the header. This is accomplished by interposing between said element and said header a silicon wafer and an adherent thin insulating film of a silicon compound disposed on said wafer.

The present invention relates to a semiconductor device with a good heat conducting and electrically insulating body interposed between a semiconductor element and a part of a casing dissipating the heat, which is joined to the intermediate body in a good heat conducting manner.

It is already known to arrange an insulating body of beryllium oxide between the collector zone of a transistor and a heat-dissipating part of a casing. As is well-known, beryllium oxide is an insulating material with extremely good heat conducting properties. The conventional construction bears the advantage that the collector zone of the transistor is insulated with respect to the part of the casing without causing the disadvanage of a poor heat dissipation from the semiconductor element to the part of the casing. With respect to high frequency transistors, this construction bears the advantage that the emitter zone of the transistor can be connected via short lead-in electrodes, to the part of the casing, so that on the emitter side, there will result a construction of low inductance. By the construction of a high frequency transistor which is of a low inductance on the emitter side, both the input and the output circuit are extensively decoupled in an arrangement comprising a grounded emitter.

The use of an intermediate body of beryllium oxide in the conventional construction, however, bears the disadvantage that bodies of beryllium oxide are expensive, difficult to manufacture, and not easily machinable. A subsequent processing of the insulating bodies out of BeO is not easily possible in view of the toxicity of the dust. A considerable disadvantage resides in the fact that the thermal expansion coefficient of the sintered body out of beryllium oxide is not adapted to that of the semiconductor material, in particular not to that of silicon. Moreover, metallic layers only adhere very badly to sintered bodies out of beryllium oxide. It is also difficult to obtain small plates of beryllium oxide with a thickness below 0.5 mm.

The disadvantages of the conventional construction employing an intermediate body out of beryllium oxide, are overcome in accordance with the present invention, in that the intermediate body consists of silicon, and in that at least on the side facing the semiconductor element, the body comprises an insulating layer of silicon oxide with an overlaying metallic intermediate layer which does not extend to the margin of the silicon oxide layer, to which there is fixed at least one lead-in electrode.

In the following the invention will now be described with reference to the sole drawing which is an isometric view, partly in section of an embodiment of this invention. In the drawing the semiconductor element is indicated by the reference numeral 1. In the present case there is concerned a planar transistor with an evaporated emitter contact electrode 13 and a base-contact electrode 16. The intermediate body 2 consists of silicon and, on the side facing the transistor, comprises a firmly produced silicon oxide layer 3. Onto the silicon oxide layer 3, for the purpose of improving the adherence, there is evaporated a layer of titanium, aluminium, nickel, chromium, silicon and/or germanium. To this layer, either by evaporation or electrolytically, there is preferably applied a layer of gold 4. When using gold for the layer 4, of course, it will have to be avoided to use aluminium for the layer applied to the silicon oxide layer, because an aluminium-gold-silicon alloy provides poor mechanical properties with respect to the ageing. The use of gold for the layer 4, however, bears the advantage that the silicon body of the element can be directly joined to the intermediate body 2 by way of alloying, i.e. in a mechanically firm and well-heat conducting manner. The intermediate body 2 out of silicon may be alloyed without causing any difficulties, to the part of a casing 5 by using conventional alloying materials.

For preventing the appearance of unwanted thermal stresses a plate or disk of molybdenum 5 is used as the part of a casing (only partly shown) which, at least on the side facing the intermediate body, is plated with gold as the alloying material. Since the layer of gold 4 does not extend to the margin of the silicon oxide layer 3, there will be obtained an insulating construction of the transistor 1 on the part of a casing. The disk or plate of molybdenum 5, in turn, is soldered to the base 6 of the casing of the semiconductor device.

Within glass seals 15, the base 6 comprises the wire-shaped lead-in electrodes 10 and 11. By the thermal compression of gold wires 8, the collector lead-in electrode 10 is joined in an electrically conducting manner to the layer of gold 4 and, consequently, to the collector zone of the transistor 1. In the same way the base lead-in electrode 11 is connected to the base electrode 16 via gold wires 9. In a similar way the emitter electrode 13 is connected via gold wires 7, to the casing portion 5.

The described construction enables the use of very short emitter wires 7, so that there will result a very low lead-in inductance to the emitter zone 13 of the transistor. The lead-in inductance becomes the lower the more gold wires 7, 8, and 9 are used (parallel arrangement).

The employment of an intermediate body out of silicon provided with a silicon oxide layer offers the following advantages: the manufacture and processing of very thin intermediate bodies out of silicon is possible without further ado with the aid of the conventional methods for the processing of plate-shaped semiconductor bodies.

Silicon is substantially more inexpensive than beryllium oxide. Thermally grown oxide layers on silicon have proved to be so solid that thermal compression connections which, as is well-known, are subjected to considerable pressures, were possible without damaging the underlaying silicon oxide layer. Finally, with respect to intermediate bodies out of silicon, it is possible to produce one or more p-n-junctions parallel in relation to the surface extension of the intermediate body. In this way it is possible to establish a good heat conducting and low-capacitance construction to the part of the casing, because the space charge capacitances of the p-n junctions are connected in series.

We claim:

1. In a semiconductor device including
a base;

an active semiconductor element comprising a body of semiconductive material having a plurality of active regions, each of said regions having a corresponding electrode contiguous therewith, one of said electrodes being adjacent a given surface of said body;

means for making electrical connection to said one electrode; and heat conductive electrically insulating means for securing said element to said base;

the improvement wherein said securing means comprises:

a silicon wafer of good thermal conductivity having upper and lower opposed major surfaces, said lower surface being bonded to said base;

an adherent thin insulating film of a silicon compound disposed on said upper wafer surface; and an adherent metallic layer disposed on said insulating film;

said given surface being bonded to a part of said metallic layer by a joint of good thermal conductivity, such that said one electrode is electrically connected to said metallic layer part;

said electrical connection means including a lead electrically bonded to another part of said metallic layer.

2. A semiconductor device according to claim 1, wherein said insulating film comprises a thermally grown oxide of silicon.

3. A semiconductor device according to claim 2, wherein said metallic layer comprises a laminate of two constituent layers, the constituent layer adjacent said insulating film comprising a metal selected from the group consisting of titanium, nickel and chromium.

4. A semiconductor device according to claim 2, wherein said metallic layer comprises a laminate of two constituent layers, the constituent layer adjacent said insulating film comprising a material selected from the group consisting of silicon and germanium.

5. A semiconductor device according to claim 3, wherein the constituent layer remote from said insulating film comprises gold.

6. A semiconductor device according to claim 1, wherein the bond between said lead and said other part of said metallic layer is a thermocompression bond.

7. A semiconductor device according to claim 1, further comprising an additional electrical connection between said base and a selected electrode other than said one electrode.

8. A semiconductor device according to claim 1, wherein said wafer comprises semiconductor material, said wafer having contiguous regions of opposite conductivity types forming a p-n-junction substantially parallel to said major surfaces whereby said junction introduces additional series capacitance thereby reducing the capacitance between said one electrode and said base.

9. A semiconductor device according to claim 2 wherein said insulating film has a central portion and peripheral portion, and said adherent metallic layer is disposed on only the central portion of said insulating film.

References Cited

UNITED STATES PATENTS

| | | | |
|---|---|---|---|
| 2,948,835 | 8/1960 | Runyan | 317—234 |
| 3,020,454 | 2/1962 | Dixon | 317—234 |
| 3,160,798 | 12/1964 | Loatens et al. | 317—234 |
| 3,252,060 | 5/1966 | Marino et al. | 317—234 |
| 3,283,224 | 11/1966 | Erkan | 317—234 |
| 3,290,570 | 12/1966 | Cunnigham | 317—240 |
| 3,366,793 | 1/1968 | Svedberg | 250—211 |

JAMES D. KALLAM, Primary Examiner

M. EDLOW, Assistant Examiner

U.S. Cl. X.R.

317—235